(12) United States Patent
Izumi (10) Patent No.: US 7,982,264 B2
(45) Date of Patent: Jul. 19, 2011

(54) SEMICONDUCTOR DEVICE (75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 176 days.

(21) Appl. No.: 11/945,085

(22) Filed: Nov. 26, 2007

(65) Prior Publication Data

US 2008/0128801 A1    Jun. 5, 2008

(30) Foreign Application Priority Data

Nov. 27, 2006    (JP) .................................. 2006-319040

(51) Int. Cl.
*H01L 29/78*    (2006.01)
(52) U.S. Cl. .......... 257/330; 257/E29.257; 257/E29.258
(58) Field of Classification Search .................. 257/192, 257/328, 330, E21.418, E21.572, E29.133, 257/E29.021, E29.257, E29.258
See application file for complete search history.

(56) References Cited

U.S. PATENT DOCUMENTS

| | | | | |
|---|---|---|---|---|
| 6,177,704 B1 * | 1/2001 | Suzuki et al. | ................. | 257/343 |
| 2003/0020134 A1 * | 1/2003 | Werner et al. | ................. | 257/471 |
| 2004/0171220 A1 * | 9/2004 | Yang et al. | ..................... | 438/270 |
| 2005/0012114 A1 * | 1/2005 | Tada et al. | ...................... | 257/192 |
| 2006/0071271 A1 * | 4/2006 | Omura et al. | ................. | 257/341 |
| 2006/0124994 A1 * | 6/2006 | Jang et al. | ...................... | 257/328 |
| 2006/0220117 A1 * | 10/2006 | Yang et al. | ..................... | 257/335 |
| 2007/0128788 A1 * | 6/2007 | Lee et al. | ...................... | 438/202 |
| 2008/0251838 A1 * | 10/2008 | Ono et al. | ..................... | 257/330 |

FOREIGN PATENT DOCUMENTS

JP    2000-349292    12/2000

* cited by examiner

*Primary Examiner* — Ken A Parker
*Assistant Examiner* — David Spalla
(74) *Attorney, Agent, or Firm* — Rabin & Berdo, PC (57) ABSTRACT

The semiconductor device according to the present invention includes a semiconductor substrate, an insulating layer laminated on the semiconductor substrate, a semiconductor layer laminated on the insulating layer, an annular deep trench having a depth reaching the insulating layer from the surface of the semiconductor layer, a source region formed on the surface layer of the semiconductor layer in a transistor forming region enclosed with the deep trench, a drain region formed on the surface layer of the semiconductor layer in the transistor forming region, an isolation region formed between the source region and the drain region for electrically isolating the source region and the drain region from each other, and a current path formed on the transistor forming region for guiding a current from the drain region to a position opposite to the source region in the vertical direction perpendicular to the surface of the semiconductor device.

18 Claims, 6 Drawing Sheets

SEMICONDUCTOR DEVICE

BACKGROUND OF THE INVENTION

1. Field of the Invention

The present invention relates to a semiconductor device including a VFET (Vertical Field Effect Transistor).

2. Description of Related Art

A VDMOSFET (Vertical Double-diffused Metal Oxide Semiconductor Field Effect Transistor) is generally known as a VFET. For example, a VDMOSFET adopting a trench gate structure increasingly forms the main stream of a power MOSFET.

Figure 3:
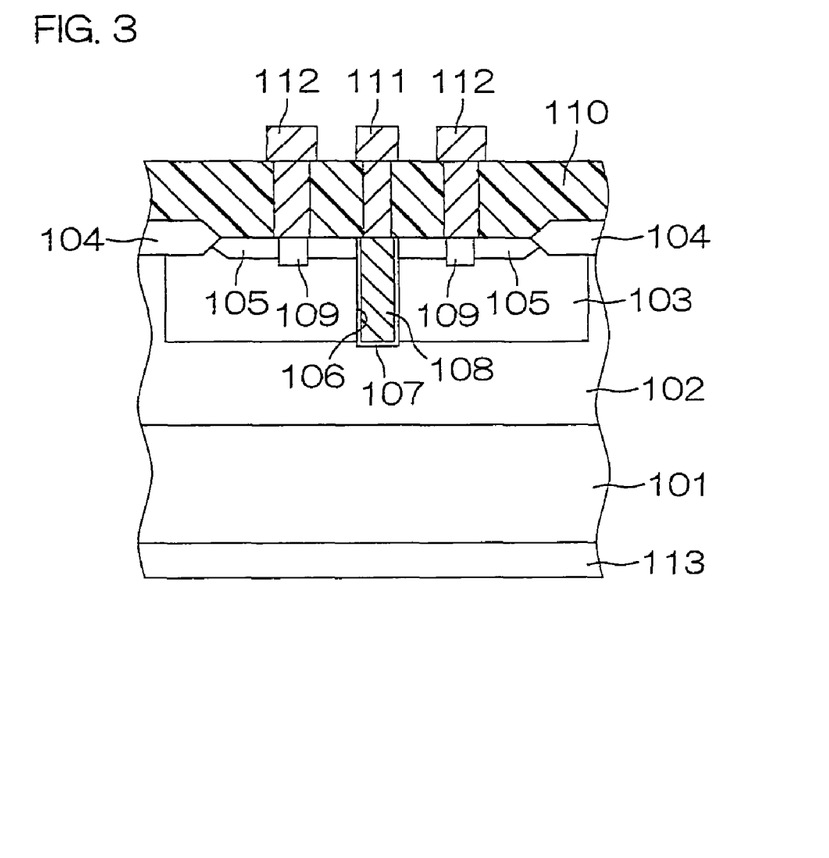
FIG. 3 is a sectional view schematically showing the structure of a conventional semiconductor device having a VDMOSFET.

FIG. 3 is a schematic sectional view of a semiconductor device having a VDMOSFET adopting a trench gate structure.

This VDMOSFET includes an $N^+$-type substrate 101. An $N^-$-type epitaxial layer 102 is laminated on the $N^+$-type substrate 101. A P-type region 103 is formed on the surface layer of the $N^-$-type epitaxial layer 102. A LOCOS 104 is formed on the surface of the $N^-$-type epitaxial layer 102 along the peripheral edge of the P-type region 103. A trench 106 is formed in the P-type region 103. The trench 106 is formed by digging down the surface of the P-type region 103 to penetrate through the P-type region 103 in the thickness direction. The inner surface of the trench 106 is covered with a gate oxide film 107. The inner side of the gate oxide film 107 is filled up with polysilicon doped with an N-type impurity of a high concentration, thereby forming a gate electrode 108 in the trench 106. In the region enclosed with the LOCOS 104, an $N^+$-type source region 105 is formed on the surface layer of the P-type region 103. A $P^+$-type source contact region 109 is formed in the source region 105 to penetrate through the source region 105.

An interlayer dielectric film 110 is laminated on the $N^-$-type epitaxial layer 102. A gate wire 111 and a source wire 112 are formed on the interlayer dielectric film 110. The gate wire 111 and the source wire 112 are connected to the gate electrode 108 and the source contact region 109 respectively through contact holes formed in the interlayer dielectric film 110.

On the other hand, a drain electrode 113 is formed on the rear surface (opposite to the side formed with the $N^-$-type epitaxial layer 102) of the $N^+$-type substrate 101.

In the VDMOSFET having this structure, a current flows from the drain electrode 113 toward the source region 105 in the direction perpendicular (vertical direction) to the surface of the $N^+$-type substrate 101. Therefore, the device area can be remarkably reduced as compared with an LDMOSFET (Lateral Double-diffused Metal Oxide Semiconductor Field-Effect Transistor).

When the drain electrode 113 is arranged on the rear surface of the $N^+$-type substrate 101, however, a high voltage is applied to the entire $N^+$-type substrate 101, whereby it is difficult to isolate the region formed with the VDMOSFET from the remaining region on the $N^+$-type substrate 101. Therefore, it is difficult to mixedly mount the VDMOSFET shown in FIG. 3 with another type of device on the $N^+$-type substrate 101.

Therefore, an up-drain type VDMOSFET is proposed as a VDMOSFET which can be mixedly mount d on the same substrate with another type of device.

Figure 4:
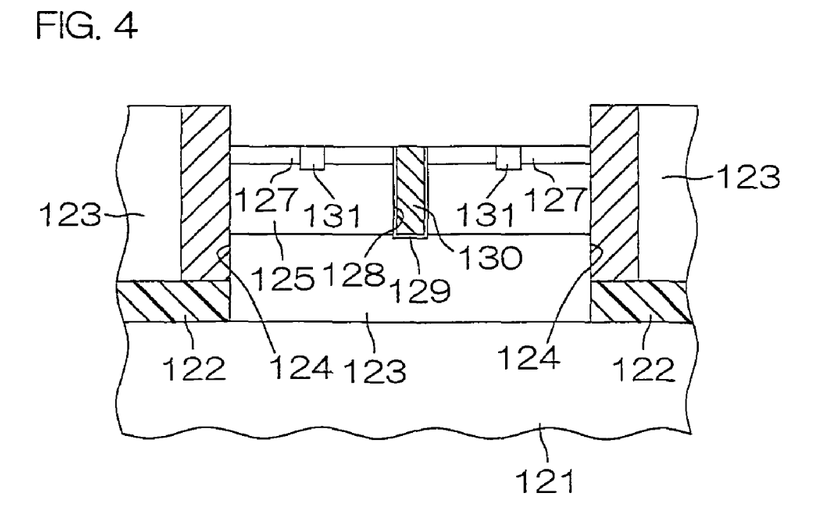
FIG. 4 is a sectional view schematically showing the structure of a conventional semiconductor having an up-drain type VDMOSFET.

In a semiconductor device having an up-drain type VDMOSFET, a box layer 122 made of silicon oxide is laminated on an $N^+$-type substrate 121, as shown in FIG. 4. The box layer 122 is partially removed so that the removed region of the box layer 122 serves as a transistor forming region. An $N^-$-type epitaxial layer 123 is laminated on the box layer 122 and the part of the $N^+$-type substrate 121 exposed from the box layer 122.

A deep trench 124 having a depth reaching the box layer 122 from the surface of the $N^-$-type epitaxial layer 123 is formed in the $N^-$-type epitaxial layer 123 to enclose the transistor forming region. The deep trench 124 is filled up with polysilicon. The deep trench 124 filled up with polysilicon isolates the VDMOSFET formed on the transistor forming region.

In the transistor forming region, a P-type region 125 is formed on the surface layer of the $N^-$-type epitaxial layer 123. A trench 128 is formed in the P-type region 125. The trench 128 is formed by digging down the surface of the P-type region 125 to penetrate through the P-type region 125 in the thickness direction. The inner surface of the trench 128 is covered with a gate oxide film 129. The inner side of the gate oxide film 129 is filled up with polysilicon doped with an N-type impurity of a high concentration, thereby forming a gate electrode 130 in the trench 128. On the surface layer of the P-type region 125, an $N^-$-type source region 127 is formed adjacent to the lateral side of the trench 128. A $P^+$-type source contact region 131 is formed in the source region 127 to penetrate through the source region 127.

In order to ensure a vertical current path from the $N^-$-type epitaxial layer 123 toward a source region 127, the box layer 122 is removed from the transistor forming region, thereby allowing conduction between the $N^+$-type substrate 121 and the $N^-$-type epitaxial layer 123.

Since the box layer 122 is removed from the transistor forming region, when the $N^-$-type epitaxial layer 123 is formed by epitaxial growth, however, a step corresponding to the thickness of the box layer 122 is formed between the surface of the region of the $N^-$-type epitaxial layer 123 located in the transistor forming region and the surface of the remaining region. While the thickness of the box layer 122 must be increased in order to increase the withstand voltage of the VDMOSFET, the step formed on the surface of the $N^-$-type epitaxial layer 123 is increased in size if the thickness of the box layer 122 is increased, a problem such as defective focusing in exposure in a lithographic process for forming a resist pattern on the $N^-$-type epitaxial layer 123.

SUMMARY OF THE INVENTION

An object of the present invention is to provide a semiconductor device having no remarkable step on the surface of a semiconductor layer laminated on a semiconductor substrate, on which a VFET and other types of device can be mixedly mounted.

A semiconductor device according to one aspect of the present invention includes a semiconductor substrate, an insulating layer laminated on the semiconductor substrate, a semiconductor layer laminated on the insulating layer, an annular deep trench having a depth reaching the insulating layer from the surface of the semiconductor layer, a source region formed on the surface layer of the semiconductor layer in a transistor forming region enclosed with the deep trench, a drain region formed on the surface layer of the semiconductor layer in the transistor forming region, an isolation region formed between the source region and the drain region for electrically isolating the source region and the drain region from each other; and a current path formed on the transistor forming region for guiding a current from the drain region to a position opposite to the source region in the vertical direction perpendicular to the surface of the semiconductor device.

According to this structure, the deepest portion of the deep trench reaches the insulating layer. This deep trench isolates the transistor forming region enclosed with the deep trench from the surroundings. In the transistor forming region, the source region and the drain region are formed on the surface layer of the semiconductor layer. The transistor forming region is formed with the current path for guiding the current from the drain region to the position opposite to the source region in the vertical direction perpendicular to the surface of the semiconductor substrate. Therefore, the current can be guided from the drain region to the position vertically opposite to the source region, to be vertically fed to the source region from this position through the semiconductor layer. In other words, an FET formed on the transistor forming region can be in a vertical structure.

This semiconductor device requires no electrical conduction between the semiconductor substrate and the semiconductor layer on the transistor forming region unlike to the conventional structure, whereby the insulating layer may not be partially removed. Therefore, no remarkable step is formed on the surface of the semiconductor layer. Thus, it is possible to present a problem such as defective focusing in exposure in a lithographic process for forming a resist pattern on the semiconductor layer.

Further, the insulating layer electrically isolates the transistor forming region, from the semiconductor substrate, whereby another type of device can be formed on the surroundings of the transistor forming region so that this device and the vertical FET (VFET) formed on the transistor forming region can be mixedly mounted on the semiconductor substrate.

The current path may include a lateral conductive layer formed on the insulating layer and a vertical conductive layer formed along the deep trench and connected to the drain region and the lateral conductive layer, as described in claim 2.

The foregoing and other objects, features and effects of the present invention will become more apparent from the following detailed description of the embodiments with reference to the attached drawings.

DETAILED DESCRIPTION OF PREFERRED EMBODIMENTS

An embodiment of the present invention is now described in detail with reference to the accompanying drawings.

Figure 1:
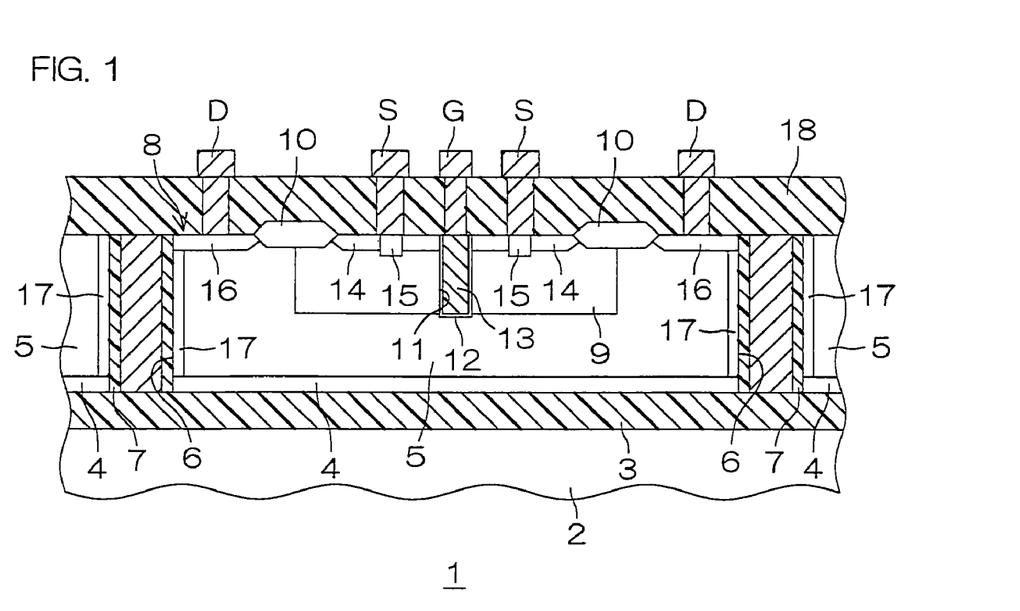
FIG. 1 is a sectional view schematically showing the structure of a semiconductor device according to an embodiment of the present invention.

FIG. 1 is a sectional view schematically showing the structure of a semiconductor device according to the embodiment of the present invention.

This semiconductor device 1 includes a P-type silicon substrate 2. A box layer 3 is laminated on the P-type silicon substrate 2 as an insulating layer made of silicon oxide. An N$^+$-type lateral conductive layer 4 made of silicon doped with an N-type impurity of a high concentration ($10^{19-21}/cm^3$) is laminated on the box layer 3. An N$^-$-type surface layer 5 is laminated on the N$^+$-type lateral conductive layer 4 as a semiconductor layer made of silicon doped with an N-type impurity of a low concentration ($10^{15-16}/cm^3$).

A deep trench 6 annular in plan view is formed to penetrate through the N$^+$-type lateral conductive layer 4 and the N$^-$-type surface layer 5 in the laminating direction (vertical direction) thereof these layers 4 and 5. In other words, the annular deep trench 6 in plan view having a depth reaching the box layer 3 from the surface of the N$^-$-type surface layer 5 is formed on the box layer 3. An oxide film 7 is formed in the deep trench 6 so as to cover the overall inner side surface thereof. The inner side of the oxide film 7 is filled up with polysilicon. This deep trench 6 isolates a region 8 enclosed the deep trench 6 from the surroundings. The region 8 serves as a transistor forming region formed with a VDMOSFET.

In the transistor forming region 8, a P-type region 9 is formed on the surface of the N$^-$-type surface layer 5 at an interval from the deep trench 6. On the surface of the N$^-$-type surface layer 5, further, a LOCOS 10 serving as an isolation region is formed in an annular shape in plan view along the peripheral edge of the P-type region 9.

A gate trench 11 is formed at the center of the region enclosed with the LOCOS 10 in plan view to vertically penetrate through the P-type region 9. A gate oxide film 12 is formed in the gate trench 11 so as to cover the overall inner surface thereof. The inner side of the gate oxide film 12 is filled up with polysilicon doped with an N-type impurity of a high concentration, thereby forming a gate electrode 13 in the gate trench 11.

Between the LOCOS 10 and the trench 11, an N$^+$-type source region 14 is formed on the surface layer of the P-type region 9. A P$^+$-type source contact region 15 is formed to vertically penetrate through this source region 14.

Between the deep trench 6 and the LOCOS 10, an N$^+$-type drain region 16 is formed on the surface layer of the N$^-$-type surface layer 5.

An N$^+$-type vertical conductive layer 17 is formed on the N$^-$-type surface layer 5 along the side surface of the deep trench 6. This N$^+$-type vertical conductive layer 17 is formed along the overall periphery of the deep trench 6, so that the vertical upper end and the vertical lower end thereof are connected to the drain region 16 and the N⁺-type lateral conductive layer 4 respectively.

An interlayer dielectric film 18 is laminated on the N⁻-type surface layer 5. A gate wire G, a source wire S and a drain wire D are formed on the interlayer dielectric film 18. The gate wire G, the source wire S and the drain wire D are connected to the gate electrode 13, the source contact region 15 and the drain region 16 respectively through contact holes formed in the interlayer dielectric film 18.

In this semiconductor device 1, as described above, the deepest portion of the deep trench 6 filled up with polysilicon reaches the box layer 3 made of silicon oxide. This deep trench 6 isolates the transistor forming region 8 enclosed with the deep trench 6 from the surroundings. In this transistor forming region 8, the source region 14 and the drain region 16 are formed on the surface of the N⁻-type surface layer 5. The N⁺-type lateral conductive layer 4 is formed between the box layer 3 and the N⁻-type surface layer 5. The N⁺-type vertical conductive layer 17 connected to the drain region 16 and the N⁺-type lateral conductive layer 4 is formed along the side surface of the deep trench 6. The N⁺-type lateral conductive layer 4 and the N⁺-type vertical conductive layer 17 form a current path in the transistor forming region 8 for guiding a current from the drain region 16 to a position vertically opposite to the source region 14. Therefore, the current from the drain region 16 can be guided to the position vertically opposite to the source region 14, to be vertically fed toward the source region 14 from this position. In other words, the FET formed on the transistor forming region 8 can be in a vertical structure.

The semiconductor device 1 requires no electrical conduction between the P-type silicon substrate 2 and the N⁻-type surface layer 5 on the transistor forming region 8 unlike the conventional structure, whereby the box layer 3 may not be partially removed. Therefore, no remarkable step is formed on the surface of the N⁻-type surface layer 5. Thus, it is possible to prevent a problem such as defective focusing in exposure in a lithographic process for forming a resist pattern on the N⁻-type surface layer 5.

Further, the box layer 3 electrically isolates the transistor forming region 8 from the P-type silicon substrate 2, whereby another types of device can be formed on the surroundings of the transistor forming region 8, so that this device and the VDMOSFET formed on the transistor forming region 8 can be mixedly mounted on the P-type silicon substrate 2.

In this semiconductor device 1, the withstand voltage can be freely set. In order to obtain a withstand voltage of 100 to 1000 V, for example, the thickness of the N⁻-type surface layer 5 may be set in the range of 10 to 100 µm. In this case, the width of the deep trench 6 is set in the range of 1 to 10 µm and the thickness of the box layer 3 is also set in the range of 1 to 10 µm, in response to the withstand voltage.

FIGS. 2A to 2L are schematic sectional views showing a method of manufacturing the semiconductor device in order of process.

Figure 2A:
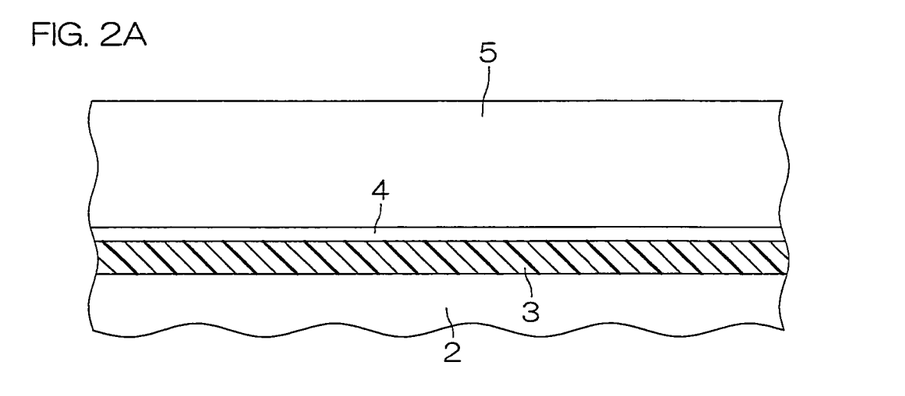
FIG. 2A is a schematic sectional view for illustrating a method of manufacturing the semiconductor device shown in FIG. 1.

First, a P-type silicon substrate (wafer) 2 is prepared. On the other hand, an N-type silicon substrate (wafer) is prepared. An N⁺-type layer containing an N-type impurity of a high concentration is formed on the surface layer of this N-type silicon substrate. An oxide film is formed on the overall surfaces (front, rear and side surfaces) of the N-type silicon substrate by oxidation. Thereafter the P-type silicon substrate 2 and the N-type silicon substrate are bonded to each other while opposing the N⁺-type layer side of the N-type silicon substrate to the P-type silicon substrate Then, exposed portions (excluding the portion in contact with the P-type silicon substrate 2) of the oxide film formed on the surfaces of the N-type silicon substrate are removed by grinding or the like. Thereafter an N-type epitaxial layer is formed on the N-type silicon substrate by epitaxial growth, if necessary. Thus, an SOI (Silicon On Insulator) substrate having the oxide film and the N⁺-type layer between the P-type silicon substrate 2 and the N-type silicon substrate is obtained, as shown in FIG. 2A. In order to manufacture the semiconductor device 1, the oxide film formed on the P-type silicon substrate 2 is utilized as the box layer 3, the N⁺-type layer is utilized as the N⁺-type lateral conductive layer 4, and the N-type silicon substrate (and the N-type epitaxial layer) is utilized as the N⁻-type surface layer 5.

Figure 2B:
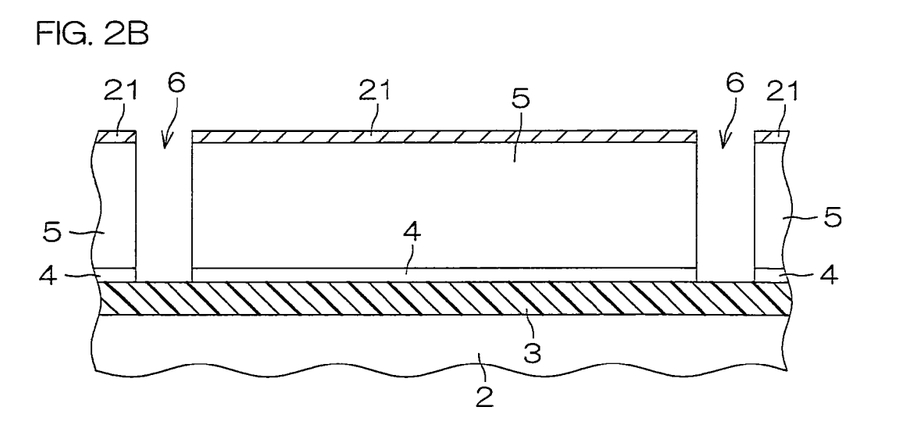
FIG. 2B is a schematic sectional view showing a step subsequent to the step shown in FIG. 2A.

Then, a thermal oxide film, a TEOS (Tetra Eth Oxy Silane) film, a silicon nitride film or a combined film thereof is formed on the N⁻-type surface layer 5. Then, the film on the N⁻-type surface layer 5 is so patterned as to form a deep trench forming hard mask 21, as shown in FIG. 2B. This deep trench forming hard mask 21 is employed for etching the N⁺-type lateral conductive layer 4 and the N⁻-type surface layer 5, thereby forming the deep trench 6 penetrating therethrough. At this time, the box layer 3 functions as an etching stop layer.

Figure 2C:
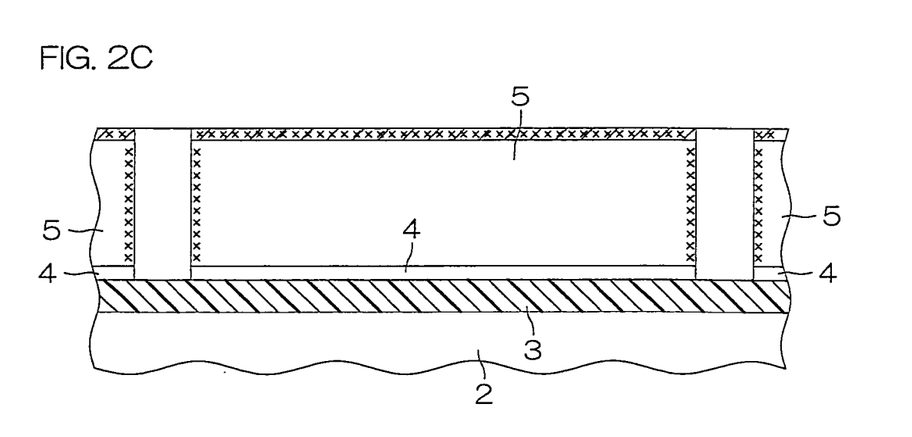
FIG. 2C is a schematic sectional view showing a step subsequent to the step shown in FIG. 2B.

Thereafter a beam of ions of an N-type impurity (phosphorus or arsenic, for example) is applied to the N-type surface layer 5 while the deep trench forming hard mask 21 remains thereon. As shown in FIG. 2C, the deep trench forming hard mask 21 is formed with a proper thickness, so that the ions of the N-type impurity can be implanted into the surface of the N⁻-type surface layer 5 facing the inside of the deep trench 6 while the front surface of the N⁻-type surface layer 5 is prevented from implantation of the ions of the N-type impurity. FIG. 2C shows the N-type impurity with "x".

In order to excellently implant the ions of the N-type impurity into the surface of the N⁻-type surface layer 5 facing the inside of the deep trench 6, the beam of the ions of the N-type impurity may be applied to the surface of the N⁻-type surface layer 5 facing the inside of the deep trench 6 at an angle in the range of 5.7 to 11.3° if the aspect ratio of the deep trench 6 is in the range of 5 to 10, while rotating the SOI substrate is rotated, for example.

Figure 2D:
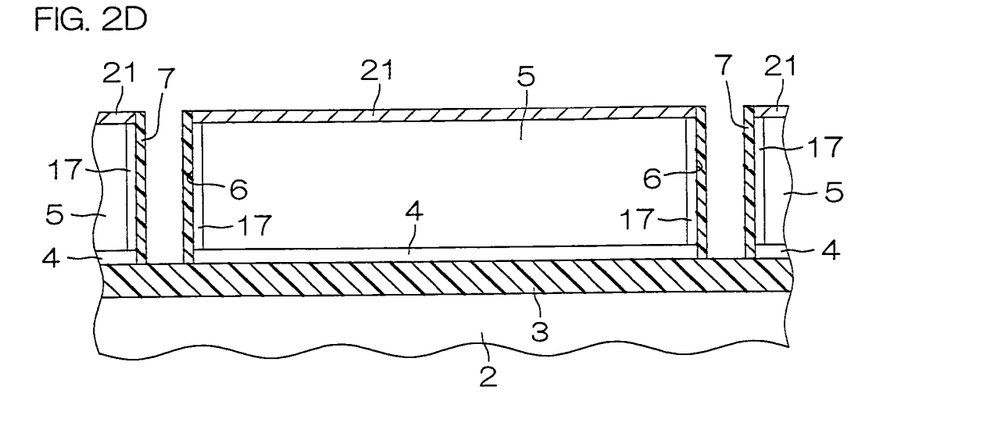
FIG. 2D is a schematic sectional view showing a step subsequent to the step shown in FIG. 2C.

After the ion implantation, the oxide film 7 is formed on the surface of the N⁻-type surface layer 5 facing the inside of the deep trench 6. The ions implanted into the surface of the N⁻-type surface layer 5 facing the inside of the deep trench 6 are activated due to the formation of the oxide film 7, thereby forming the N⁺-type vertical conductive layer 17 along the side surface of the deep trench 6, as shown in FIG. 2D.

Figure 2E:
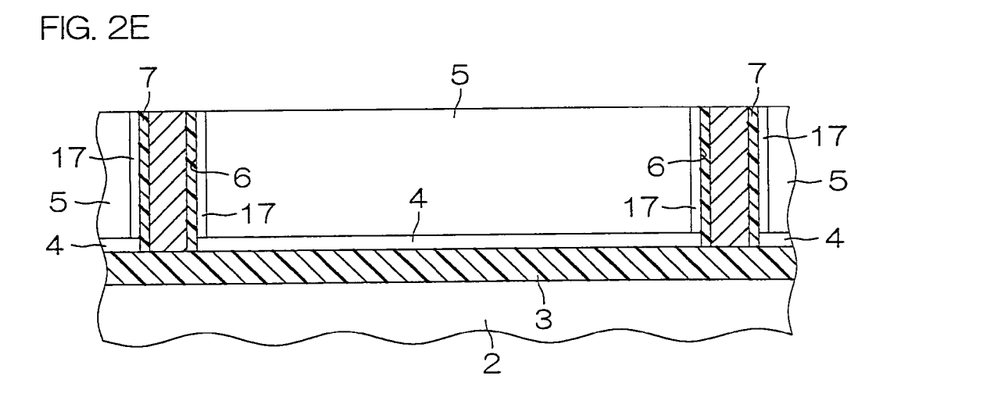
FIG. 2E is a schematic sectional view showing a step subsequent to the step shown in FIG. 2D.

Then, polysilicon is deposited by CVD (Chemical Vapor Deposition) to fill up the inside of the deep trench 6 and to cover the deep trench forming hard mask 21. Then, the polysilicon outside the deep trench 6 is removed by etch-back or CMP (Chemical Mechanical Polishing) along with the deep trench forming hard mask 21, as shown in FIG. 2E.

Figure 2F:
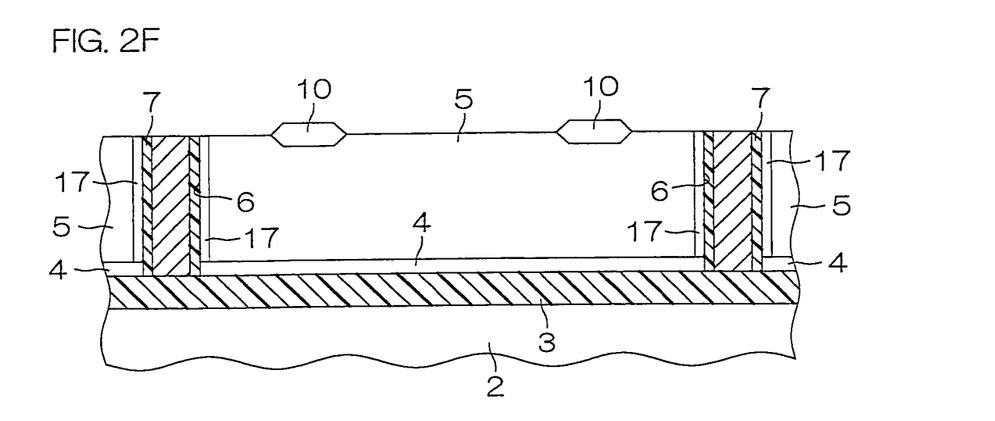
FIG. 2F is a schematic sectional view showing a step subsequent to the step shown in FIG. 2E.

Thereafter the LOCOS 10 is formed by LOCOS, as shown in FIG. 2F.

Figure 2G:
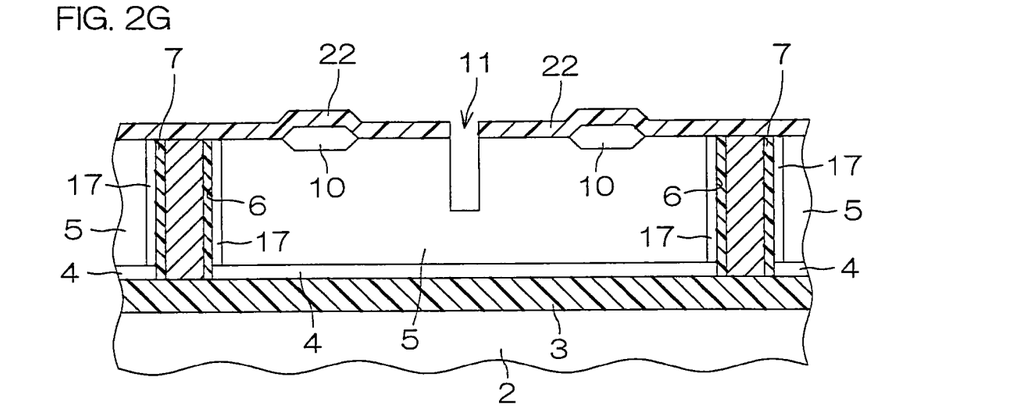
FIG. 2G is a schematic sectional view showing a step subsequent to the step shown in FIG. 2F.

Then, a pattern 22 of a thermal oxide film or a silicon nitride film is formed on the N⁻-type surface layer 5, as shown in FIG. 2G. This pattern 22 has an opening corresponding to the gate trench 11 shown in FIG. 1, and covers the remaining portion of the surface of the N⁻-type surface layer 5. Thereafter the pattern 22 is employed as a mask for etching the N⁻-type surface layer 5, thereby forming the gate trench 11.

Figure 2H:
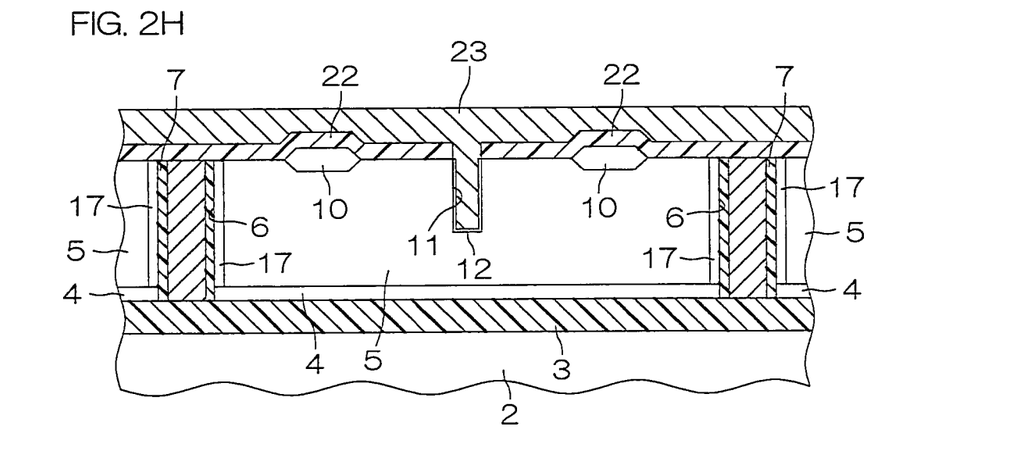
FIG. 2H is a schematic sectional view showing a step subsequent to the step shown in FIG. 2G.

Then, the gate oxide film 12 covering the overall inner surface of the gate trench 11 is formed by thermal oxidation employing the pattern 22 as an oxidation-resistant mask, as shown in FIG. 2H. Thereafter polysilicon 23 is deposited by CVD so as to fill up the gate trench 11 and cover the pattern 22. Then, the polysilicon 23 outside the gate trench 11 is removed by etch-back along with the pattern 22.

Figure 2I:
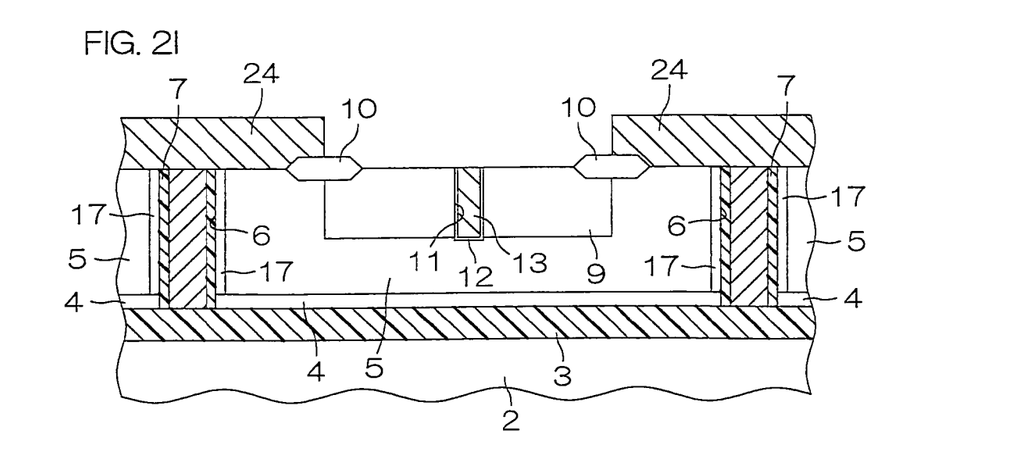
FIG. 2I is a schematic sectional view showing a step subsequent to the step shown in FIG. 2H.

Thereafter a resist film 24 having an opening exposing the region of the N⁻-type surface layer 5 enclosed with the LOCOS 10 is formed on the N⁻-type surface layer 5, as shown in FIG. 2I. Then, ions of a P-type impurity (boron, for example) are implanted into the surface of the N⁻-type surface layer 5 through the opening of the resist film 24. Thus, the P-type region 9 is formed on the surface of the N⁻-type surface layer 5. The resist film 24 is removed after this ion implantation.

Figure 2J:
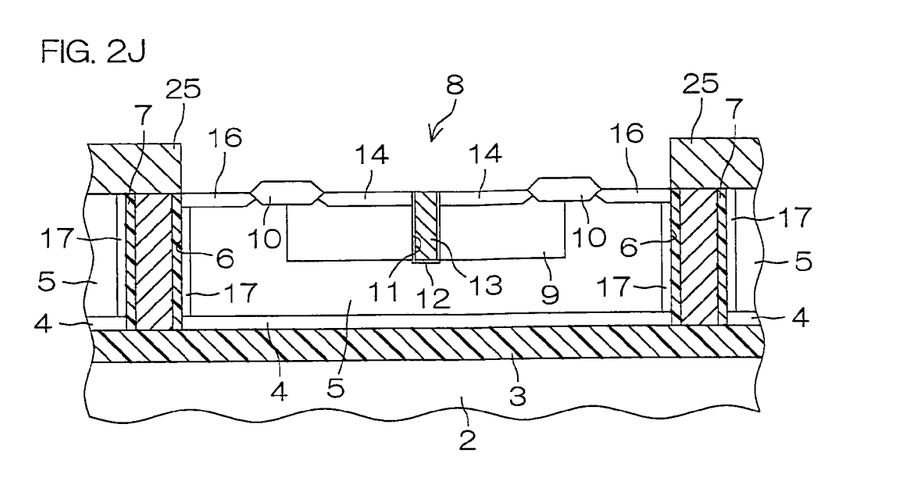
FIG. 2J is a schematic sectional view showing a step subsequent to the step shown in FIG. 2I.

Then, a resist film 25 having an opening exposing the transistor forming region 8 is formed on the N⁻-type surface layer 5, as shown in FIG. 2J. Then, ions of an N-type impurity are implanted into the surface of the N⁻-type surface layer 5 through the opening of the resist film 25. Thus, the source region 14 is formed on the surface of the P-type region 9, and the drain region 16 is formed on the surface of the N⁻-type surface layer 5. The resist film 25 is removed after this ion implantation.

Figure 2K:
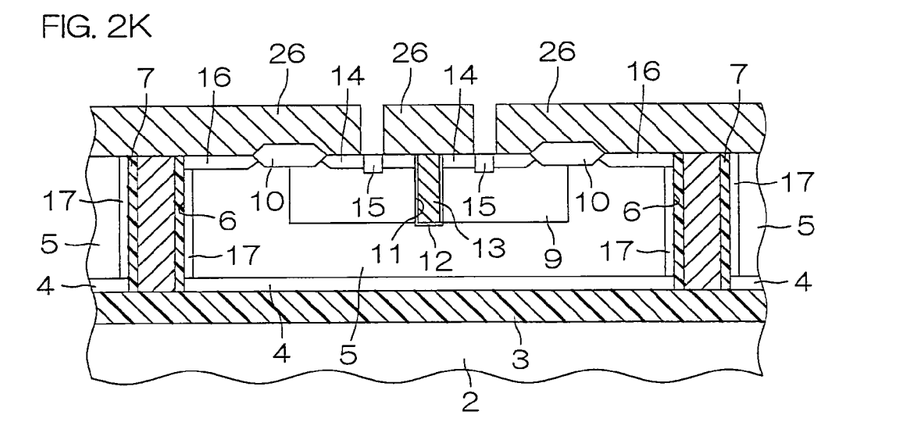
FIG. 2K is a schematic sectional view showing a step subsequent to the step shown in FIG. 2J.
Figure 2L:
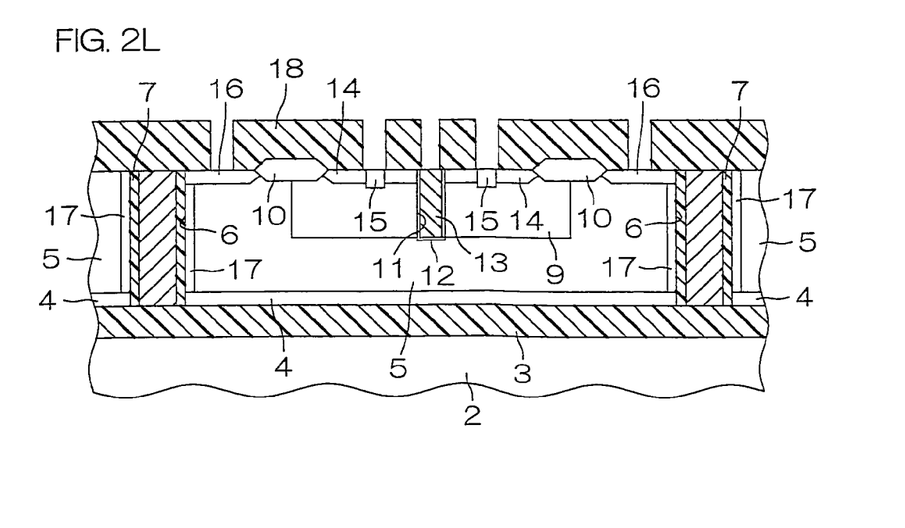
FIG. 2L is a schematic sectional view showing a step subsequent to the step shown in FIG. 2K.

Then, a resist film 26 having an opening corresponding to the source contact region 15 shown in FIG. 1 is formed on the N⁻-type surface layer 5, as shown in FIG. 2K. Then, ions of a P-type impurity are implanted into the source region 14 through the opening of the resist film 26. Thus, the source contact region 15 is obtained. The resist film 26 is removed after this ion implantation.

After the above-mentioned processes are carried out, the material (silicon oxide or silicon nitride, for example) of the interlayer dielectric film 18 is deposited on the N⁻-type surface layer 5 by CVD and the film of the deposited material is patterned, thereby forming the interlayer dielectric film 18. Then, the gate wire G, the source wire S and the drain wire D are formed on the interlayer dielectric film 18, there by obtaining the semiconductor device 1 shown in FIG. 1.

While the embodiment of the present invention has been described, the present invention can be carried out in another mode. Ion implantation is employed as the method of doping the surface of the N⁻-type surface layer 5 facing the inside of the deep trench 6 with the N-type impurity, however, thermal diffusion may alternatively be employed. For example, a PSG film may be formed in the deep trench 6 and on the deep trench forming hard mask 21, or $POCl_3$ may be supplied into the deep trench 6 and onto the deep trench forming hard mask 21 for doping the surface of the N⁻-type surface layer 5 facing the inside of the deep trench 6 with phosphorus employed as the N-type impurity.

The SOI substrate employed for manufacturing the semiconductor device 1 may alternatively be formed by a method other than the above-mentioned method. For example, the SOI substrate may be formed as follows: According to this method, the P-type silicon substrate (wafer) 2 and the N-type silicon substrate (wafer) are first prepared. Then, an oxide film is formed on the overall surfaces (front, rear and side surfaces) of the N-type silicon substrate by oxidation. Thereafter the P-type silicon substrate 2 and the N-type silicon substrate are bonded to each other. Then, the N-type silicon substrate is partially removed by grinding or the like to have a desired thickness (the thickness of the N⁺-type lateral conductive layer 4). Then, the N-type silicon substrate is doped with an N-type impurity by ion implantation or coating diffusion. Thus, the N-type silicon substrate is converted to the N⁺-type lateral conductive layer 4 doped with the N-type impurity of a high concentration. Thereafter the N⁻-type surface layer 5 is formed on the N⁺-type lateral conductive layer 4 by epitaxial growth. Consequently, an SOI substrate having the same structure as that shown in FIG. 2A is obtained.

Further, the conductivity types of the semiconductor portions of the semiconductor device 1 may be inverted. In other words, the P-type portions and the N-type portions may be N-type and P-type portions respectively in the semiconductor device 1.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-319040 filed with the Japanese Patent Office on date Nov. 27, 2006, the disclosure of which is incorporated herein by reference.

What is claimed is:

1. A semiconductor device comprising:
   a semiconductor substrate;
   an insulating layer laminated on the semiconductor substrate;
   a semiconductor layer, doped with an impurity, laminated on the insulating layer;
   an annular deep trench having a depth reaching the insulating layer from the surface of the semiconductor layer;
   a source region formed on the surface layer of the semiconductor layer in a transistor forming region enclosed with the deep trench;
   a gate electrode provided in a gate trench formed in the transistor forming region adjacent to the source region;
   a gate insulation film interposed between the gate electrode and the semiconductor layer;
   a drain region formed on the surface layer of the semiconductor layer in the transistor forming region;
   an isolation region formed on the surface layer of the semiconductor layer between the source region and the drain region for electrically isolating the source region and the drain region from each other; and
   a current path formed on the transistor forming region for guiding a current from the drain region to a position opposite to the source region in the vertical direction perpendicular to the surface of the semiconductor device,
   wherein the current path includes a lateral conductive layer formed on the insulating layer and a vertical conductive layer formed along the deep trench and connected to the drain region and the lateral conductive layer, and
   the lateral conductive layer is made of silicon, doped with the impurity at a higher concentration than the semiconductor layer.

2. The semiconductor device according to claim 1, wherein
   the transistor forming region includes a region of opposite conductivity type to that of the source region,
   the source region and the gate electrode are formed in the region of opposite conductivity type, and
   the isolation region includes a LOCOS formed on a periphery of the region of opposite conductivity type.

3. The semiconductor device according to claim 1, wherein a width of the vertical conductive layer is smaller than a width of the drain region.

4. The semiconductor device according to claim 1, wherein a thickness of the semiconductor layer is in a range of 10 to 100 μm.

5. The semiconductor device according to claim 1, wherein a type of device other than a VFET (Vertical Field Effect Transistor) formed in the transistor forming region is formed on a surrounding of the transistor forming region.

6. The semiconductor device according to claim 1, wherein an oxide film is formed in the deep trench so as to cover an inner side surface thereof.

7. The semiconductor device according to claim 6, wherein an inner side of the oxide film is filled up with polysilicon.

8. The semiconductor device according to claim 1, wherein the deep trench is annular in plan view.

9. The semiconductor device according to claim 2, wherein the LOCOS is formed in an annular shape in plan view.

10. The semiconductor device according to claim 9, wherein the gate trench is formed at center of a region enclosed with the LOCOS in plan view.

11. The semiconductor device according to claim 10, wherein the source region is formed between the LOCOS and the gate trench.

12. The semiconductor device according to claim 9, wherein the drain region is formed between the deep trench and the LOCOS.

13. The semiconductor device according to claim 5, wherein the transistor forming region is electrically isolated from the semiconductor substrate by a box layer.

14. The semiconductor device according to claim 13, wherein a thickness of the box layer is set in a range of 1 to 10 µm.

15. The semiconductor device according to claim 1, wherein a surface layer is laminated on the lateral conductive layer.

16. The semiconductor device according to claim 1, wherein a concentration of impurities in the lateral conductive layer is in a range of $10^{19-21}/cm^3$.

17. The semiconductor device according to claim 15, wherein a concentration of impurities in the surface layer is in a range of $10^{15-16}/cm^3$.

18. The semiconductor device according to claim 15, wherein a thermal oxide film, a TEOS film, a silicon nitride film or a combination thereof is formed on the surface layer.

* * * * *